United States Patent [19]

Hezel et al.

[11] Patent Number: 4,891,325
[45] Date of Patent: Jan. 2, 1990

[54] METHOD FOR RE-USING SILICON BASE MATERIAL OF A METAL INSULATOR SEMICONDUCTOR (MIS) INVERSION-LAYER SOLAR CELL

[75] Inventors: Rudolf Hezel, Spardorf; Winfried Hoffmann, Hanau; Berthold Schum, Biebergemünd, all of Fed. Rep. of Germany

[73] Assignee: Nukem GmbH, Hanau, Fed. Rep. of Germany

[21] Appl. No.: 219,449

[22] Filed: Jul. 14, 1988

[30] Foreign Application Priority Data

Jul. 30, 1987 [DE] Fed. Rep. of Germany ....... 3725346

[51] Int. Cl.[4] ............................................. B01J 17/00
[52] U.S. Cl. ...................................... 437/2; 437/923; 437/228; 357/15; 357/30
[58] Field of Search .................. 437/2, 4, 923; 357/15, 357/30 J

[56] References Cited

U.S. PATENT DOCUMENTS

| | | | |
|---|---|---|---|
| 3,559,281 | 2/1971 | Nhayberry | 437/923 |
| 4,013,485 | 3/1977 | Nha | 437/923 |
| 4,062,102 | 12/1977 | Lawrence | 437/923 |
| 4,253,881 | 3/1981 | Hezel | 357/54 |
| 4,403,239 | 9/1983 | Yamazaki | 357/305 |
| 4,404,421 | 9/1983 | Frass | 357/305 |
| 4,404,422 | 9/1983 | Green | 357/305 |
| 4,495,375 | 1/1985 | Rickus | 357/305 |
| 4,640,002 | 2/1987 | Phillips | 437/2 |
| 4,806,496 | 2/1989 | Suzuki | 437/923 |
| 4,828,628 | 5/1989 | Hezel | 357/305 |

FOREIGN PATENT DOCUMENTS 0043871  3/1985  Japan .................. 437/923

Primary Examiner—Brian E. Hearn
Assistant Examiner—Anthony Gutierrez
Attorney, Agent, or Firm—Beveridge, DeGrandi & Weilacher

[57] ABSTRACT

A method is proposed for re-using silicon base material of defective MIS inversion-layer solar cells, where at least MIS solar cell-specific layers are stripped off and replaced by corresponding new layers.

10 Claims, 1 Drawing Sheet

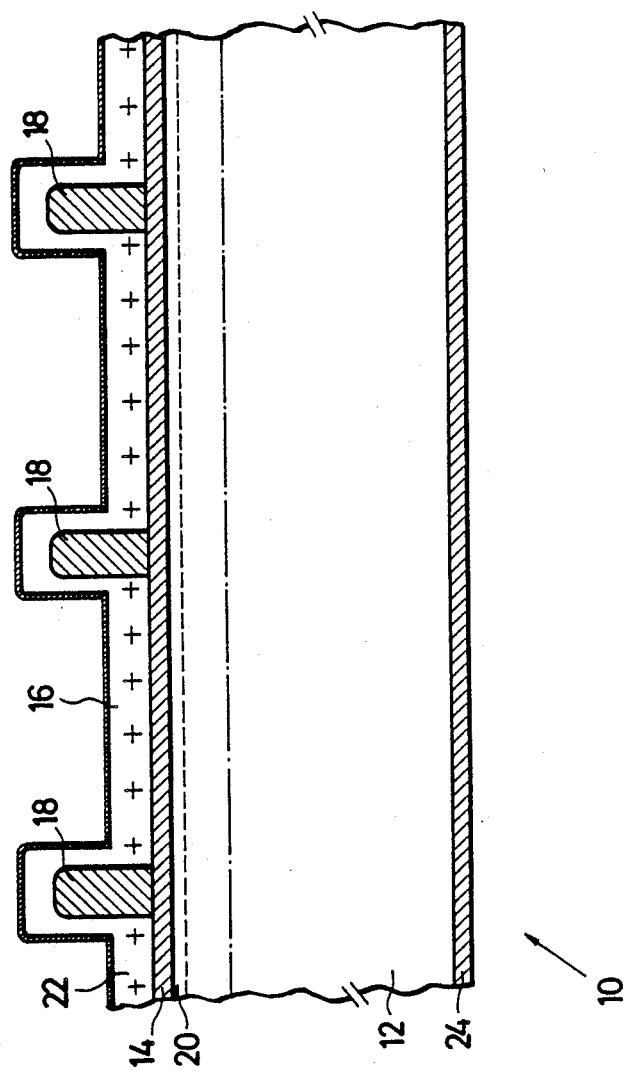

METHOD FOR RE-USING SILICON BASE MATERIAL OF A METAL INSULATOR SEMICONDUCTOR (MIS) INVERSION-LAYER SOLAR CELL

BACKGROUND OF THE INVENTION

The invention relates to a method for re-using silicon base material (S) of a metal insulator semiconductor (MIS) inversion-layer solar cell, where a first electrically conductive contact of full-area or partial type is arranged on one side of the base material, and the MIS solar cell-specific layers are arranged on the opposite side, said MIS layers being in the form of a first insulating layer (I) such as a silicon oxide layer, a second electrically conductive contact (M) provided on said first insulating layer and designed preferably in finger or lattice form, and a further insulating layer such as a silicon nitride or silicon oxynitride layer.

The worldwide development of photovoltaics for terrestrial use has been accompanied by continuous efforts to reduce the cost of producing solar cells. A major step forward was achieved with the MIS inversion-layer solar cell in particular, known from DE-PS 28 46 096, for example, whereby inexpensive polycrystalline solar cell silicon can be used, as this results in high efficiency with favourable manufacturing costs.

The base material of a corresponding cell comprises a mono- or polycrystalline p-conducting silicon. A first electrically conductive contact—partial or full-area—is deposited on the rear side. A silicon oxide layer of around 1.5 nm thickness as an insulating layer is deposited on the opposite side, preferably by a brief thermal oxidation process at relatively low temperature (approx. 500° C.). The front contact, to be designated the second electrically conductive contact, is then deposited, and should have a finger or lattice structure. After provision of this contact the surface of the silicon oxide layer is coated with alkali ions, particularly cesium ions, in a subsequent immersion process in an solution containing alkali metal. A second insulating layer is then applied, preferably in the form of silicon nitride or silicon oxynitride. This is achieved with a plasma-assisted CVD (chemical vapour deposition) process at low temperatures (approx. 250° C.) where a silicon nitride or silicon oxynitride layer approx. 80 nm thick is deposited that keeps the alkali ions such as cesium ions in their position. The necessary inversion layer is generated by influence in the silicon base material. The silicon nitride or silicon oxynitride layer doubles as an antireflection coating.

The mode of operation of the MIS inversion-layer solar cell model can now be described as follows.

Incident light between the areas forming the second electrical contact generates in the silicon base material electron-hole pairs which are separated in an electrical field. This field is generated by the presence of a stationary, positive surface charge at the nitride/oxide boundary layer, which induces in the silicon side facing the oxide a comparable charge of moving electrons and adjacent thereto a depletion zone. The layer having a thickness of approx. 10 to 50 nm with the moving electrons changes or inverts the conduction type of the silicon base material. The separated holes diffuse to the first electrically conductive contact, the rear electrode, while the electrons inside the conductive inversion layer wander to the second electrically conductive contact designed preferably in finger or lattice form, tunnel through the silicon oxide layer, and reach the external circuit.

Solar cells not conforming to specification—whether this is due to manufacturing method or ageing—are treated as rejects. It would however be desirable to be able to use such cells or at least parts of them further, so reducing the overall costs for manufacture of corresponding MIS inversion-layer solar cells.

It is therefore the object of the present invention to indicate a method for re-using silicon base material in an MIS inversion-layer solar cell which is both inexpensive and technically simple to implement.

SUMMARY OF THE INVENTION

The object is attained in accordance with the invention principally by at least MIS solar cell-specific layers in the form of the second insulating layer and the second electrically conductive contact being stripped off and replaced by corresponding new layers. The advantage of this is that the silicon base material of a non-specification solar cell—whether defective or old—is re-usable, and as is known affects up to 30% of the manufacturing costs of a solar cell. Preferably, not only the second insulating layer and the second electrically conductive contact are removed, but also at least the alkali metal ions in the first insulating layer and the first electrically conductive contact, in order to then apply corresponding layers to the silicon base material chip and thereby to provide a new and functioning MIS inversion-layer solar cell. The base material chip can be etched beforehand to remove existing impurities and/or defects etc. Optionally, the layers to be stripped off can be removed selectively or as a unit. Here it is possible to emply a chemical or plasma-chemical etching process. To permit a time-saving process sequence, it can be arranged for the second insulating layer to be stripped off first and then, preferably simultaneously, the first and second electrical contacts.

To remove the first and second electrically conductive contacts and the second insulating layer, the MIS inversion-layer solar cell can be immersed in a mineral acid such as $O-H_3PO_4$ at a temperature between 50° C. and 100° C.

Alternatively, there is the possibility of stripping off the second insulating layer by plasma etching for example in a $C_2F_6/O_2$ gas phase, or by plasma-chemical etching for example in an $NF_3$ gas phase. It is of course also possible to remove the MIS solar cell-specific layers as a unit, for example mechanically.

Finally, the silicon base material for re-use can be used for a new MIS inversion-layer solar cell so that the rear of the old cell is the front of the new one and vice versa.

Further details and advantages of the invention are made clear in the claims and the features to be found therein, singly and/or in combination.

Further details, advantages and features of the invention are given in the following description of an embodiment shown in the drawing and in process sequences described in this connection.

BRIEF DESCRIPTION OF THE DRAWINGS

The only FIGURE shows an MIS inversion-layer solar cell.

DESCRIPTION OF THE PREFERRED EMBODIMENTS

The only FIGURE shows an MIS inversion-layer solar cell (10) in a purely diagrammatic form, with the cell having the following fundamental design. A first insulating layer (14) in the form of silicon oxide is deposited on the front of a p-doped silicon base material (12). An electrically conductive contact (18) is partially provided on said first insulating layer, preferably in finger or lattice form. The minority charge carriers generated in the semiconductor material by incident light are discharged via said contact (18). The silicon oxide layer (14) and the electrical contact (18) are then covered by a second insulating layer (16) in the form of silicon nitride or silicon oxynitride. A further electrically conductive contact (24) is provided on the rear which can be deposited over the full area—as in the embodiment—but also partially, as for the front contact. In the silicon nitride or silicon oxynitride layer (16) there must be a high density of positive charge, comprising the natural charge or charges obtained from external ions, which induce an inversion layer (20) of electrons at the surface of the p-doped silicon base material. The electrons generated by the light then diffuse to the front, i.e. to the electrically conductive contact (18), are accelerated in the electrical field generated by the positive insulator charges (22), and wander along the conductive inversion layer (20) to the electrically conductive contact (18) in order to be discharged after tunnelling through the silicon oxide layer (14).

If a correspondingly formed MIS inversion-layer solar cell is no longer in conformance with specifications, the silicon base material (12) can be re-used for the new solar cell by removal in particular of the MIS solar cell-specific layers.

Stripping of the appropriate layers is explained in greater detail on the basis of the following examples.

EXAMPLE A

The solar cell (10) is immersed in $O-H_3PO_4$ at temperatures between 50° C. and 150° C., preferably in the range between 100° C. and 120° C. After a brief period—depending on the selected temperature—in the minute range the full-area, electrically conductive rear contact (24) of aluminium dissolves, giving off hydrogen. After a further period for reaction, which is in the magnitude of hours, the second front insulating layer (22) in the form of silicon oxynitride including the electric contact, (18) also of aluminium, also dissolves. Removal preferably follows then of the ion elements present in the silicon oxide layer (14) of the first main group, preferably caesium. The silicon base material (12), which can also be called a wafer, can then be subjected to a polishing etchant so that it can be used to make a new MIS inversion-layer solar cell in the usual way. The polishing etchant may have a composition of one part HF (50%) and 6 parts $HNO_3$ (70%).

EXAMPLE B

Corresponding to example A the electrically conductive contact (24) can be removed, whereas the second insulating layer (22) in the form of silicon nitride can be stripped off by plasma-etching to accelerate the process. This may be either in a $C_2F_6/O_2$ (ratio 60%:40%) or in an $NF_3$ plasma-chemical etching process. The electrically conductive contact (18) of aluminium can also be removed corresponding to stripping of the contact (24).

The procedure is preferably such that first the layer (22) is removed and then the electrical contacts (18) and (24) in one operation. Polishing etching of the silicon base material (12) then takes place as described in example A.

EXAMPLE C

The front silicon nitride layer (22) including the alkali metal ions and the electrically conductive contact system (18) are subjected to mechanical abrading. For this purpose the solar cell (10) is arranged on a turntable and treated with the aid of an abrasive means. Removal of the contact (24) and etching of the silicon base material (12) then follows in accordance with example A. Alternatively, the contact (24) can also be removed by mechanical abrasion.

EXAMPLE D

Once the second insulating layer (22) in the form of silicon nitride has been removed from the MIS inversion-layer solar cell, the electrical contacts (18) and (24) are stripped off in a plasma-chemical etching process. For this purpose, the cell (10) freed of the silicon nitride layer (22) is placed in a plasma reactor and treated with chlorine as the etchant at a plasma output of 50 to 500 Watts, preferably 150 to 250 Watts. Typically, the etching process should remove approx. 1 $\mu$m per minute.

If the base material (12) has been freed of all layers (14), (16), (18), (24), the new layers to be deposited must not be arranged on the same side as the previously stripped-off layers. Instead the front of the original solar cell (10) can be used as the rear of the new solar cell and vice versa.

We claim:

1. A method for re-using silicon base material (S) of a metal insulator semiconductor (MIS) inversion-layer solar cell, where a first electrically conductive contact of full-area or partial type is arranged on one side of the base material and the MIS solar cell-specific layers are arranged on the opposite side, said MIS layers being in the form of a first insulating layer (I) such as a silicon oxide layer, a second electrically conductive contact (M) provided on said first insulating layer and designed preferably in finger or lattice form, and a further insulating layer such as a silicon nitride or silicon oxynitride layer, characterized in that at least MIS solar cell-specific layers in the form of the second insulating layer (16) and the second electrically conductive contact (18) are stripped off and replaced by corresponding new layers.

2. A method according to claim 1, characterized in that alkali metal ions such as cesium ions embedded in the first insulating layer (14) are removed.

3. A method according to claim 1, characterized in that the various layers are stripped off selectively.

4. A method according to claim 1, characterized in that the layers are stripped off by a chemical or plasma-chemical etching process.

5. A method according to claim 1, characterized in that the second insulating layer (16) is stripped off first and then, preferably simultaneously, the first and second electrical contacts (18, 24).

6. A method according to claim 1, characterized in that to remove the first and second electrically conductive contacts (18, 24) and the second insulating layer (16) the MIS inversion-layer solar cell (10) can be immersed in a mineral acid, preferably $O-H_3PO_4$ at a temperature between 50° C. and 100° C.

7. A method according to claim 1, characterized in that the second insulating layer (16) is stripped off by plasma etching for example in a $C_2F_6/O_2$ gas phase or by plasma-chemical etching for example in an $NF_3$ gas phase.

8. A method according to claim 1, characterized in that the MIS solar cell-specific layers (14, 18) can be removed as a unit, for example mechanically.

9. A method according to claim 1, characterized in that the electrically conductive contacts (18, 24) are stripped off plasma-chemically, preferably with chlorine as the etchant gas.

10. A method according to claim 1, characterized in that the layers to be deposited are arranged on the opposite side of the silicon base material (12) to that which was used for the stripped-off layers.

* * * * *